United States Patent
Pisarenco et al.

(10) Patent No.: US 9,939,250 B2
(45) Date of Patent: Apr. 10, 2018

(54) METHODS AND APPARATUS FOR CALCULATING ELECTROMAGNETIC SCATTERING PROPERTIES OF A STRUCTURE AND FOR ESTIMATION OF GEOMETRICAL AND MATERIAL PARAMETERS THEREOF

(71) Applicant: ASML Netherlands B.V., Veldhoven (NL)

(72) Inventors: Maxim Pisarenco, Veldhoven (NL); Irwan Dani Setija, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/036,471

(22) PCT Filed: Nov. 4, 2014

(86) PCT No.: PCT/EP2014/073702
§ 371 (c)(1),
(2) Date: May 13, 2016

(87) PCT Pub. No.: WO2015/078670
PCT Pub. Date: Jun. 4, 2015

(65) Prior Publication Data
US 2016/0273906 A1    Sep. 22, 2016

(30) Foreign Application Priority Data
Nov. 26, 2013 (EP) ..................... 13194521

(51) Int. Cl.
G01B 11/24 (2006.01)
G01B 11/02 (2006.01)
G03F 7/20 (2006.01)

(52) U.S. Cl.
CPC ............. *G01B 11/02* (2013.01); *G03F 7/705* (2013.01); *G03F 7/70625* (2013.01); *G03F 7/70633* (2013.01)

(58) Field of Classification Search
CPC ............... G01N 15/14; G01N 15/1459; G01N 2015/0038; G01N 2015/1493;
(Continued)

(56) References Cited

U.S. PATENT DOCUMENTS 9,235,662 B2    1/2016 Liu
9,619,607 B2    4/2017 Tao et al.
(Continued)

FOREIGN PATENT DOCUMENTS

CN    1947062 A    4/2007
CN    103226644 A    7/2013
(Continued)

OTHER PUBLICATIONS

Written Opinion of the International Searching Authority with Search Report directed to App. No. PCT/EP2014/073702, dated Feb. 18, 2015; 9 pages.
(Continued)

*Primary Examiner* — Michael P Stafira
(74) *Attorney, Agent, or Firm* — Sterne, Kessler, Goldstein & Fox P.L.L.C.

(57) ABSTRACT

In scatterometry, a merit function including a regularization parameter is used in an iterative process to find values for the scattering properties of the measured target. An optimal value for the regularization parameter is obtained for each measurement target and in each iteration of the iterative process. Various methods can be used to find the value for the regularization parameter, including the Discrepancy
(Continued)

Principle, the chi-squared method and novel modifications of the Discrepancy Principle and the chi-squared method including a merit function.

14 Claims, 5 Drawing Sheets

(58) Field of Classification Search
CPC ............. G01N 33/585; G01N 15/1425; G01N 33/54313; G01N 21/95607; G01N 21/47; G01N 21/9501; G01N 15/1468; G01N 2021/6439; G01N 21/4788
See application file for complete search history.

(56) References Cited

U.S. PATENT DOCUMENTS

| | | | |
|---|---|---|---|
| 2011/0098992 | A1 | 4/2011 | Van Beurden et al. |
| 2011/0218789 | A1* | 9/2011 | Van Beurden ...... G03F 7/70625 703/13 |
| 2012/0243004 | A1* | 9/2012 | El Gawhary .......... G01B 11/24 356/601 |
| 2013/0000505 | A1 | 1/2013 | Tao et al. |
| 2013/0066597 | A1* | 3/2013 | Van Beurden ..... G01N 21/4788 703/1 |
| 2013/0144560 | A1* | 6/2013 | Pisarenco .............. G01N 21/47 702/189 |

FOREIGN PATENT DOCUMENTS

| | | |
|---|---|---|
| EP | 1 628 164 A2 | 2/2006 |
| JP | 2013-015831 A | 1/2012 |
| KR | 1020130090368 A | 8/2013 |
| TW | 201303482 A | 1/2013 |

OTHER PUBLICATIONS

Goray, L., "Solution of the inverse problem of diffraction from low-dimensional periodically arranged nanocrystals." Proc. of SPIE, vol. 8083, 80830L; 12 pages, 2011.

Heidenreich, S., et al., "Alternative methods for uncertainty evaluation in EUV scatterometry." Proc. of SPIE, vol. 8789, 87890T; 8 pages, 2013.

Henn, M-A., et al., "The effect of line roughness on DUV scatterometry." Proc. of SPIE, vol. 8789, 87890U; 6 pages, 2013.

Henn, M-A., et al., "Improved geometry reconstruction and uncertainty evaluation for extreme ultraviolet (EUV) scatterometry based on maximum likelihood estimation." Proc. of SPIE, vol. 8083, 80830N; 10 pages, 2011.

Morozov, V. A., "On the solution of functional equations by the method of regularization," Doklady, No. 3, 1966; pp. 414-417.

Heinz et al., "A posteriori parameter choice for general regularization methods for solving linear ill-posed problems," Applied Numerical Mathematics, vol. 4, No. 5, Jul. 1988; pp. 395-417.

Hamarik et al., "On the choice of the regularization parameter in ill-posed problems with approximately given noise level of data," Journal of Inverse and Ill-Posed Problems, vol. 14, No. 3, 2006; pp. 251-266.

Mead, J. L., "A priori weighting for parameter estimation," Journal of Inverse and Ill-Posed Problems, vol. 16, 2008; pp. 175-193.

Hansen, P. C., "The L-curve and its use in the numerical treatment of inverse problems," Advances in Computational Bioengineering, vol. 4, 2000; 24 pages.

Wahba, G., "Practical Approximate Solutions to Linear Operator Equations When the Data are Noisy*," SIAM Journal on Numerical Analysis, vol. 14, No. 4, Sep. 1977; pp. 651-667.

Golub et al., "Generalized Cross-Validation as a Method for Choosing a Good Ridge Parameter," Technometrics, vol. 21, No. 2, May 1979; pp. 215-223.

Reginska, T., "A Regularization Parameter in Discrete Ill-Posed Problems," SIAM Journal on Scientific Computing, vol. 17, No. 3, May 1996; pp. 740-749.

Hansen et al., "Exploiting Residual Information in the Parameter Choice for Discrete Ill-Posed Problems," BIT Numerical Mathematics, vol. 46, Mar. 2006; pp. 41-59.

Rust et al., "Residual periodograms for choosing regularization parameters for ill-posed problems," Inverse Problems, vol. 24, Jun. 2008; 30 pages.

Mallows, C. L., "Some Comments on C P," Technometrics, vol. 15, No. 4, Nov. 1973; pp. 661-675.

Morozov, V.A., "Methods for Solving Incorrectly Posed Problems," "Chapter 2: Criteria for Selection of Regularization Parameter," Springer-Verlag New York Inc., Nov. 1984; pp. 32-64.

International Preliminary Report on Patentability directed to related International Patent Application No. PCT/EP2014/073702, dated May 31, 2016; 7 pages.

English-language Abstract of Chinese Patent Publication No. 103226644 A, published Jul. 31, 2013; 2 pages.

* cited by examiner

METHODS AND APPARATUS FOR CALCULATING ELECTROMAGNETIC SCATTERING PROPERTIES OF A STRUCTURE AND FOR ESTIMATION OF GEOMETRICAL AND MATERIAL PARAMETERS THEREOF

CROSS-REFERENCE TO RELATED APPLICATIONS

This application claims the benefit of EP application 13194521, which was filed on Nov. 26, 2013 and which is incorporated herein in its entirety by reference.

FIELD

The present invention relates to calculation of electromagnetic scattering properties of structures and estimation of geometrical and material parameters thereof.

The invention may be applied for example in metrology of microscopic structures, for example to assess critical dimensions (CD) performance of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

More generally, it would be useful to be able to compare the scattered radiation with scattering behaviors predicted mathematically from models of structures, which can be freely set up and varied until the predicted behavior matches the observed scattering from a real sample. For CD reconstruction of 1D- or 2D-periodic structures (e.g. gratings) a Volume Integral Method (VIM) can be used to efficiently compute the solution of the pertaining scattering problem, as has been disclosed in US patent application publication no. US2011/0218789 A1 and US patent application publication no. US2011/0098992 A1, which are incorporated herein by reference. For finite periodic structures the aperiodic RCWA can be used as has been disclosed in US patent application publication no. US2013/0144560 A1.

SUMMARY

It is desirable in the field of semiconductor processing to rapidly perform accurate calculations of electromagnetic scattering properties.

According to a first aspect of the present invention, there is provided a method of calculating electromagnetic scattering properties of a structure, the structure including materials of differing properties and the structure being periodic in at least one lateral direction and extending in a direction orthogonal with respect to the at least one lateral direction, the method comprising: measuring radiation scattered from the structure to obtain measurement data; providing a prior estimate of the electromagnetic scattering properties of the structure; deriving a regularization coefficient from the measurement data; obtaining estimates of the scattering properties by using trial values of the scattering properties and the regularization coefficient in a mathematical model of scattering of radiation by the structure; determining whether a termination condition is met by reference to a merit function, parameters of the merit function including the regularization coefficient and the prior estimate and the estimates of the scattering properties; and if the termination condition is not met, iteratively repeating obtaining prediction data and deriving a regularization coefficient until the termination condition is satisfied; whereby the new trial values provided by the final iteration represent the calculated electromagnetic scattering properties.

According to a second aspect of the present invention there is provided an inspection apparatus for estimating electromagnetic scattering properties of a structure of an object, the inspection apparatus comprising: an illumination system configured to illuminate the object with radiation; a detection system configured to detect an electromagnetic scattering property arising from the illumination; and a processor configured to: estimate the electromagnetic scattering properties.

According to a third aspect of the present invention, there is provided a computer program product containing one or more sequences of machine-readable instructions for calculating electromagnetic scattering properties of a structure, the instructions being adapted to cause one or more processors to perform a method according to the first aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 7A:
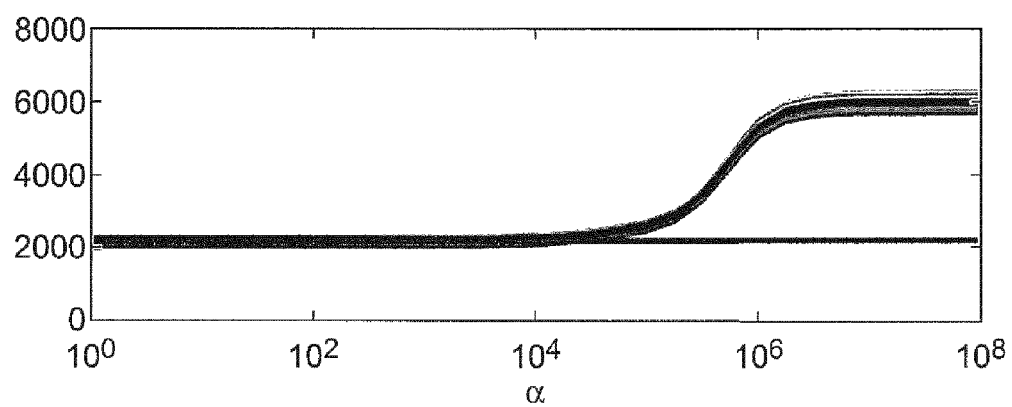
Figure 7B:
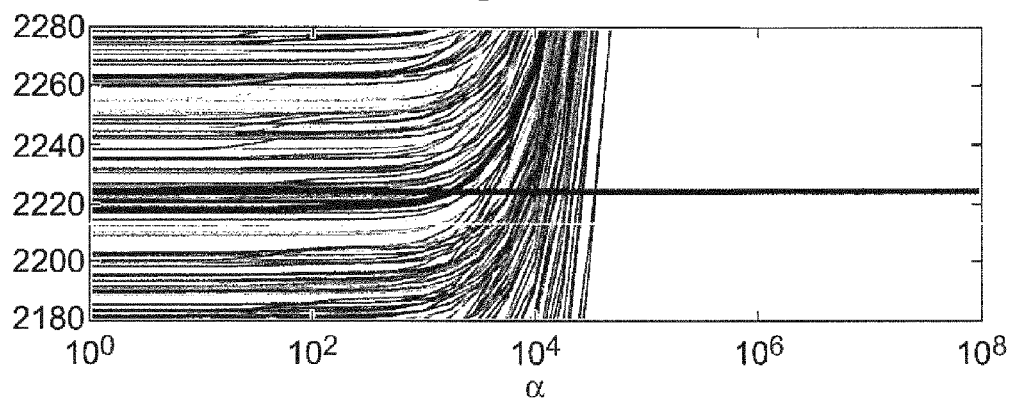

FIGS. 7A and 7B plot the cost function F as a function of the regularization coefficient $\alpha$ for some synthesized measurement data.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. Before describing such embodiments in more detail, however, it is instructive to present example environments in which embodiments of the present invention may be implemented.

Figure 1:
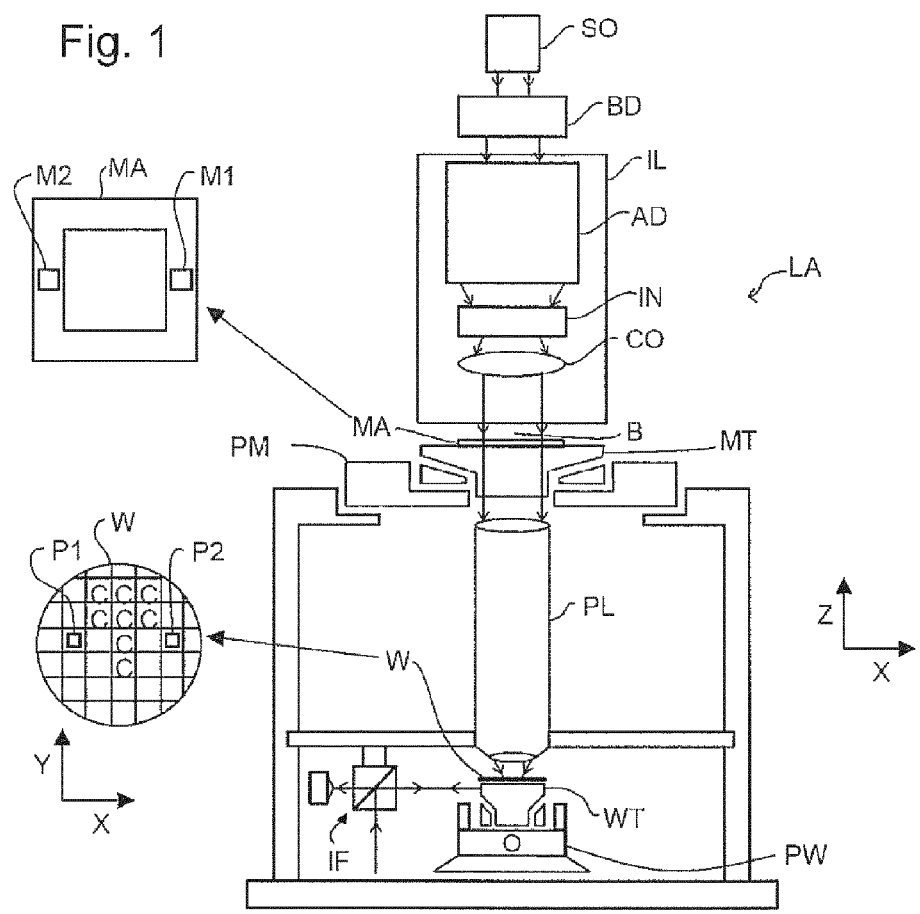
FIG. 1 depicts a lithographic apparatus.

FIG. 1 schematically depicts a lithographic apparatus. The apparatus comprises: an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
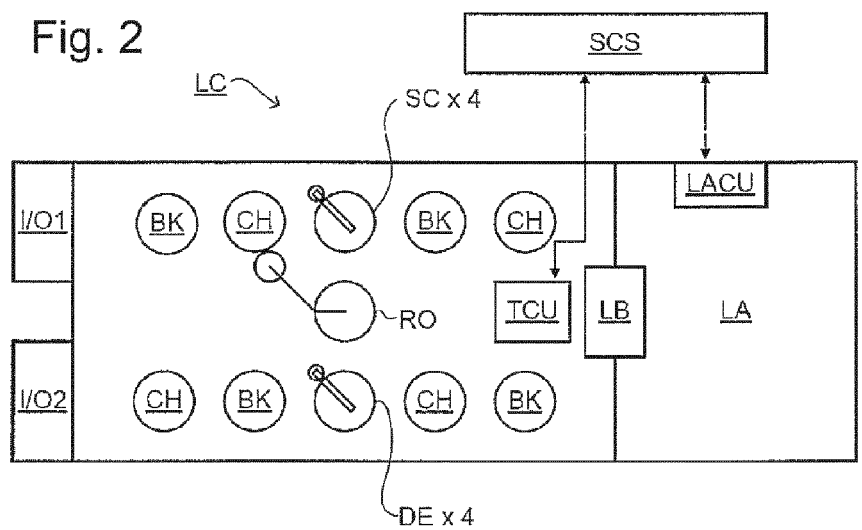
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
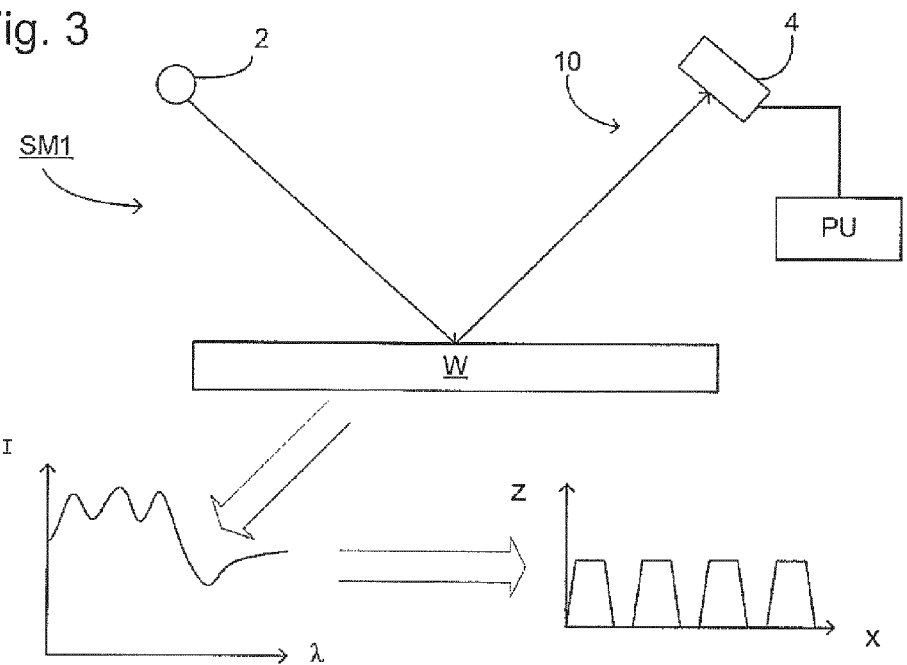
FIG. 3 depicts a first scatterometer.

FIG. 3 depicts a scatterometer which may be used in an embodiment of the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., conventionally by Rigorous Coupled Wave Analysis (RCWA) and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
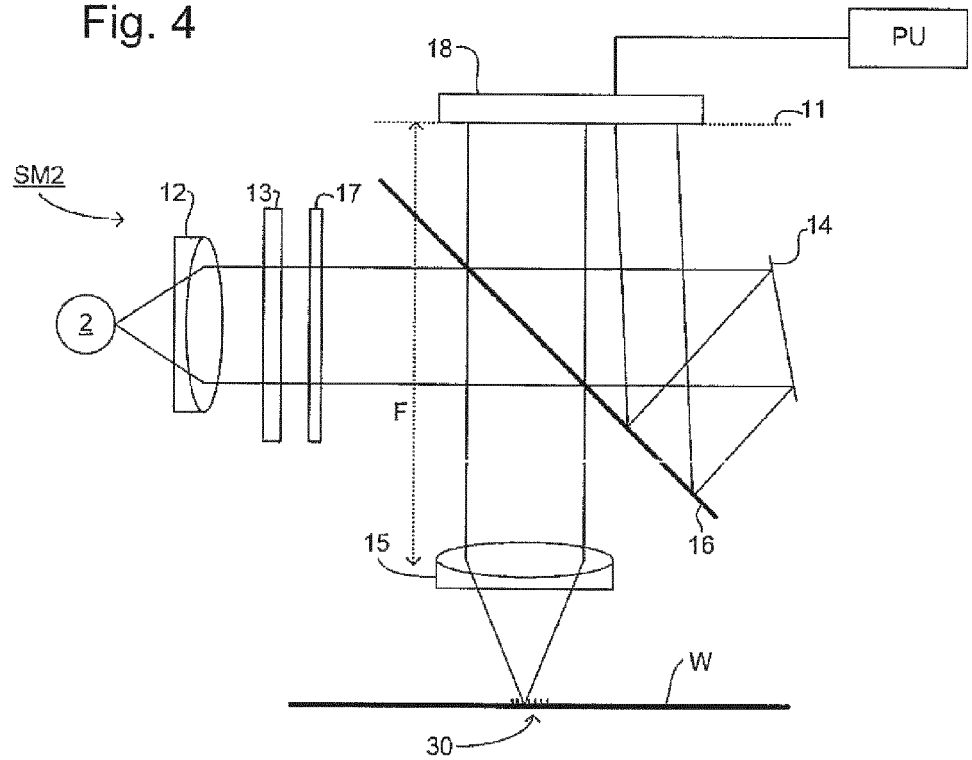
FIG. 4 depicts a second scatterometer.

Another scatterometer that may be used in an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Modeling

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using one of the scatterometers described above in combination with modeling of a target structure such as the target 30 and its diffraction properties, measurement of the shape and other parameters of the structure can be performed in a number of ways. In a first type of process, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process, diffraction spectra for many different candidate structures are calculated in advance to create a 'library' of diffraction spectra. Then the diffraction pattern observed from the measurement target is compared with the library of calculated spectra to find a best fit. Both methods can be used together a coarse fit can be obtained from a library, followed by an iterative process to find a best fit.

In a practical embodiment of reconstruction of a structure, the structure is defined by a limited number of parameters, such as dimensions and optical properties. For example, a structure might be defined as a plurality of layers (also known as a stack) and the parameters include the thickness, width, refractive index and extinction coefficient of each layer. Some of these parameters, e.g. the optical parameters, might be well known and are treated as constants in the model. Other parameters are to be determined and are treated as variables. The variables are sometimes referred to as "floats". The number of variables might be of the order of 5 to 10. The regularization approach allows the number of floats to increase to 20 and beyond.

At the same time, the image captured by the scatterometer might have a large number of pixels, e.g. 2000 or more, each of which is a data point by which the predicted spectrum or pupil image can be compared to the measured spectrum or pupil image. The matching problem, finding a predicted signal that matches the measured signal, is therefore overdetermined. There is a danger that the matching process will fit the noise in the signal rather than the underlying parameters. Therefore it is desirable to regularize the matching problem. The term "regularization" refers to a process of introducing additional information in order to solve an ill-posed problem or to prevent overfitting.

As an example of regularization, a regularization factor $\alpha$ and a prior estimate $p_a$ are introduced into the nonlinear merit function F, as follows:

$$F = \|G(p) - f\|_{C_f^{-1}}^2 + \alpha^2 \|p - p_a\|^2 \quad (1)$$

where G is the forward diffraction model, p is the vector of floating parameters, f is the measured signal, $C_f^{-1}$ refers to weighting the data residual with the noise covariance matrix and $p_a$ is the a priori parameter vector, i.e. a prior estimate of the likely values of the parameters. The operator $\|\ldots\|$ represents the Euclidean norm. The merit function can also be referred to as the cost function. In an embodiment of the invention, this merit function is used to find estimated values of parameters p that minimize the value of F.

However, for such a regularization approach, known as Tikhonov regularization, to provide an improved result, suitable values for the regularization factor $\alpha$ and the prior estimate have to be used. In a previously proposed method, the prior estimate and a possible range of values around it are estimated in advance based on knowledge of the lithographic processes used to make the structure being measured. The regularization parameter is then derived from the prior estimate and range. This process requires manual input from a skilled operator and substantial computational resource. The method is carried out off-line, e.g. in advance, and the results applied to a set of measurements taken from one or more substrates.

In an embodiment of the present invention, a value for the regularization factor $\alpha$ is calculated, for each measurement. To compute $\alpha$, an nth-order polynomial needs to be solved. Several different methods to determine a suitable value for the regularization factor $\alpha$ can be used in embodiments of the invention. Among them are the discrepancy principle [1], generalized discrepancy principle [2, p. 52], modified discrepancy principle [3], transformed discrepancy principle [4] and the chi-squared principle [5]. All these methods rely on some information about the noise model $\Delta f_N$. Other parameter choice methods that do not require this information are the L-curve [6, 7], generalized cross validation (GCV) [8, 9], unbiased predictive risk estimator (UPRE) [10], Regińska's rule [11] and the normalized cumulative periodogram (NCP) [12, 13]. Use of the Discrepancy Principle, the chi-squared method and novel modifications of these approaches, in embodiments of the invention is described in more detail below.

Figure 5:
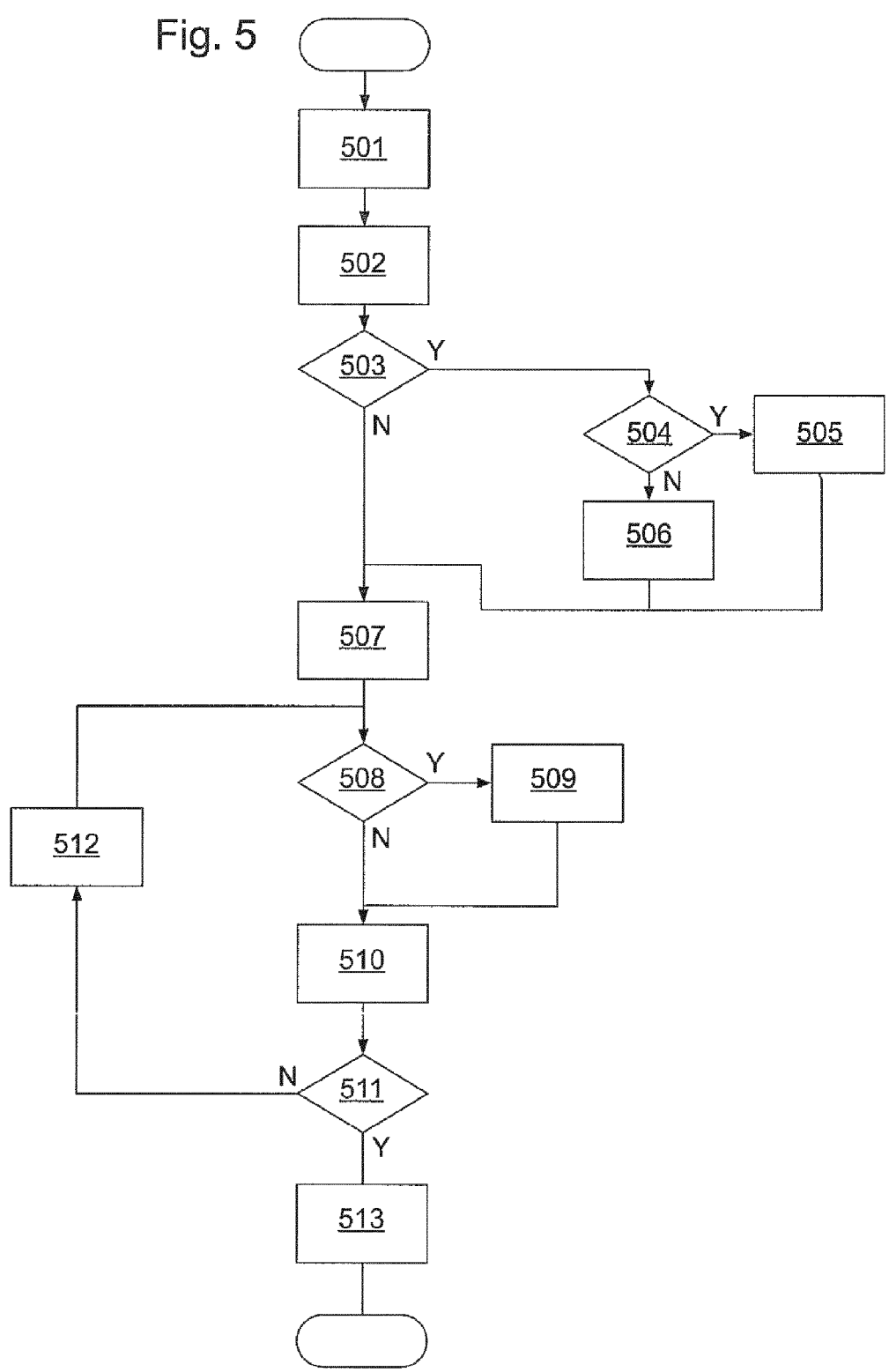
FIG. 5 depicts an example process using an embodiment of the invention for reconstruction of a structure from scatterometer measurements.

FIG. 5 illustrates an embodiment of the invention. The target will be assumed for this description to be a 1-dimensional (1-D) structure. In practice it may be 2-dimensional, and the processing will be adapted accordingly.

In step 501 a model recipe G is established which defines a parameterized model of the target structure in terms of a number of parameters $p_i$ ($p_1$, $p_2$, $p_3$ and so on). These parameters represent scattering properties of the structure, for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Importantly, while a target structure may be defined by dozens of parameters describing its shape and material properties, the model recipe will define many of these to have fixed values, while others are to be variable or 'floating' parameters for the purpose of the following process steps. The floating parameters are collectively referred to as the vector p.

In step 502 an initial estimate of the values of the parameters is obtained, based knowledge of the process used to create the structure. It is customary to denote the iteration number by a superscript: $p^{(k)}=p^{(0)}$. Each initial estimate for a floating parameter will be generated within a predetermined range. These are collectively referred to as $p_a$.

A decision, step 503, is taken as to whether regularization is to be applied in the determination of the parameter values. If so, a further decision is made, step 504, as to whether a set value of the regularization coefficient $\alpha$ is to be used, if so an off-line calculation, step 505 is performed as known in the art. If not, a flag is set in step 506 to indicate that the regularization coefficient $\alpha$ is to be calculated during the determination of the parameter values, this is referred to below as on-line regularization.

In step 507 the diffraction pattern is measured using a scatterometer, such as one of those described above, to give measurement results f. This measured diffraction pattern is forwarded to a calculation system such as a computer. The calculation system may be the processing unit PU referred to above, or it may be a separate apparatus.

In step 508 it is determined whether the flag is set to indicate that on-line regularization is to be used, and if so, a value for the regularization coefficient $\alpha$ is calculated in step 509. The method for calculating the regularization coefficient $\alpha$ is described below. As will be described below, the process for determining the parameter values is an iterative process and steps 508 and 509 are within the loop of the iteration so that when on-line regularization is performed, a value for the regularization coefficient $\alpha$ is calculated in each iteration.

In step 510, using G, $\alpha$, f and $p_a$ a value for the merit function F is obtained. If on-line regularization is being performed, the value for the regularization coefficient $\alpha$ calculated in the most recent iteration of step 509 is used. If off-line regularization is used, the value for the regularization coefficient $\alpha$ determined in step 505 is used in each iteration. If no regularization is to be used, the regularization coefficient $\alpha$ is set to zero. To obtain a value for the merit function F, the parameters representing the estimated shape, together with the optical properties of the different elements of the model, are used to calculate the scattering properties, for example using a rigorous optical diffraction method such as RCWA or any other solver of Maxwell equations. This gives an estimated or model diffraction pattern of the estimated target shape which is compared to the measured diffraction pattern by the merit function.

The estimated or model diffraction pattern calculated at 510 can be expressed in various forms. Comparisons are practical if the calculated pattern is expressed in the same form as the measured pattern. For example, a modeled spectrum can be compared easily with a spectrum measured by the apparatus of FIG. 3; a modeled pupil pattern can be compared easily with a pupil pattern measured by the apparatus of FIG. 4. Based on this comparison, new values for the estimated shape are set and calculation of the merit function repeated in an iterative process. In order to assist the search, the calculations in step 510 may further generate partial derivatives of the merit function, indicating the sensitivity with which increasing or decreasing a parameter will increase or decrease the merit function, in this particular region in the parameter space. The calculation of merit functions and the use of derivatives are generally known in the art, and will not be described here in detail.

If the termination condition indicating that the iterative process has converged on a solution with a desired accuracy, e.g. that the value of the merit function, or a derivative of the merit function is less than a threshold, is determined in step 511 to be met, $\hat{p}$ is output as the determined values of the floating parameters. If not, another iteration is performed. The computation time of this iterative process is largely determined by the forward diffraction model used, i.e. the calculation of the estimated model diffraction pattern using a rigorous optical diffraction theory from the estimated target structure. If more parameters are required, then there are more degrees of freedom. The calculation time increases in principle proportionally to the number of floating paratmeters or the $3^{rd}$ power of the number of harmonics.

Various methods for determining a value for the regularization coefficient $\alpha$ can be used as mentioned above. Below are described the use of the Discrepancy Principle, the $chi^2$ method, and novel variations thereon, that are referred to herein as the compact Discrepancy Principle and the compact $chi^2$ method.

In the iterative Gauss-Newton process to determine the parameters, the non-linear operator G in equation (1) is approximated by its derivative, the Jacobian $J_G$, and so the following linear equation is solved:

$$F = \|J_G p - \Delta f\|_{C_f^{-1}}^2 + \alpha^2 \|p - p_a\|^2 \qquad (2)$$

where $$\Delta f = f - G(p^{(k)}) + J_G(p^{(k)}) p^{(k)} \qquad (3)$$

Everything in this merit function is known except for the regularization coefficient $\alpha$. We solve for the floating parameters as a function of the unknown $\alpha$ to give:

$$(J_G^T J_G + \alpha^2 I)\hat{p} = (J_G^T \Delta f + \alpha^2 p_a) \qquad (4)$$

Given this solution, the Discrepancy Principle states that the optimal regularization coefficient $\alpha$ is the value for which:

$$F^d(\hat{p}(\alpha)) = \|J_G \hat{p}(\alpha) - \Delta f\|_{C_f^{-1}}^2 = m \qquad (5)$$

where m is the number of datapoints, e.g. the number of pixels in the spectrum or pupil image captured by the scatterometer.

The $chi^2$ method gives a slightly different value as follows:

$$F^t(\hat{p}(\alpha)) = \|J_G \hat{p}(\alpha) - \Delta f\|_{C_f^{-1}}^2 + \alpha^2 \|\hat{p}(\alpha) - p_a\|^2 = m \qquad (6)$$

Equations (5) and (6) are non-linear equations that can be solved using a standard Newton method. As a starting value for the regularization coefficient $\alpha$, a value from a previous iteration can be used, or for the first iteration a value can be chosen from a wide range from $10^{-1}$ to $10^3$. The solution of equations (5) and (6) is not computationally expensive. Either may be used in an embodiment of the invention. The value of the regularization coefficient $\alpha$ is used in the calculation of the merit function F in step 510.

In cases where m>>n (n being the number of floating parameters), which is usually true for scatterometry, noise in the measurements means that the curves $F^d(\hat{p}(\alpha))$ and $F^t(\hat{p}(\alpha))$ have a stochastic nature. At the $\lim_{\alpha \to 0} F^{d \ or \ t}(\hat{p}(\alpha))$ varies by $\sqrt{2(m-n)}$ and in some cases there may be no solution for eqs. 5 and 6. In that event, the compact Discrepancy Principle or the compact $chi^2$ method can be used.

According to the compact Discrepancy Principle and the compact $chi^2$ method, the Singular Value Decomposition (SVD) is used to reduce the number of datapoints m.

Using this approach, the solution to the minimization of the merit function of equation (1), i.e. the value of $\alpha$ for which $$\frac{dF}{dp} = 0,$$

can be written as:

$$(J_G^T J_G + \alpha^2 I)\hat{p} = (J_G^T f + \alpha^2 p_a) \quad (7)$$

where $J_G^T$ is the transpose of $J_G$ and I is the identity matrix. If we use the SVD of the scattering operator $$J_G = USV^T \quad (8)$$

where U is the matrix (m×m) of singular vectors in pixel space, S is the singular value matrix, and $V^T$ is the transpose of the matrix (n×n) of singular vectors in parameter space, we can rewrite equation (7) to $$(S^T S + \alpha^2 I)\hat{x} = (S^T U^T f + \alpha^2 x_a) \quad (9)$$

where we have introduced the normalized variable $$x \equiv V^T p \quad (10)$$

Since the matrix at the lhs of equation (9) is diagonal, we can solve for the components of $\hat{x}$ separately, so that $$\hat{p} = \sum_{i=1}^{n} \hat{x}_i V_{\cdot,i} = \sum_{i=1}^{n} \left( \frac{s_i (U_{\cdot,i})^T f + \alpha^2 x_{a,i}}{s_i^2 + \alpha^2} \right) V_{\cdot,i} \quad (11)$$

where $V_{\cdot,i}$ are the column vectors of V.

We now have the solution to the minimization of equation (1) in terms of the known measured signal f and the known a priori vector $p_a$ and the unknown regularization factor $\alpha$.

Using the solution in equation (11), expressions for the data residual as a function of $\alpha$, are derived:

$$J_G \hat{p} - f = US\hat{x} - f = \sum_{i=1}^{n} \left( \frac{s_i^2 (U_{\cdot,i})^T f + \alpha^2 s_i x_{a,i}}{s_i^2 + \alpha^2} \right) U_{\cdot,i} - \sum_{i=n+1}^{m} [(U_{\cdot,i})^T f] U_{\cdot,i}$$

$$= \sum_{i=1}^{n} \left( \frac{\alpha^2}{s_i^2 + \alpha^2} \right)(-(U_{\cdot,i})^T f + s_i x_{a,i}) U_{\cdot,i} - \sum_{i=n+1}^{m} [(U_{\cdot,i})^T f] U_{\cdot,i} \quad (12)$$

The orthogonality of the eigenmodes in signal space leads to a simple expression for the norm of the data residual:

$$\|J_G \hat{p}(\alpha) - f\|^2 = (J_G \hat{p}(\alpha) - f)^T (J_G \hat{p}(\alpha) - f) \quad (13)$$

$$= \sum_{i=1}^{n} \left( \frac{\alpha^2}{s_i^2 + \alpha^2} \right)^2 (-(U_{\cdot,i})^T f + s_i x_{a,i})^2 + \sum_{i=n+1}^{m} [(U_{\cdot,i})^T f]^2$$

The noise is contained in modes (n+1)→m. The term with modes 1→n goes to zero as a goes to zero. Thus, the optimal value of the regularisation coefficient can be obtained from either of the following equations which represent the compact Discrepancy Principle and Compact chi² method respectively:

$$\sum_{i=1}^{n} \left( \frac{\alpha^2}{s_i^2 + \alpha^2} \right)^2 (\sigma^2 + (s_i \Delta x_{a,i})^2) = n\sigma^2 \quad (14)$$

$$\sum_{i=1}^{n} \frac{(\alpha^4 + \alpha^2 s_i^2)}{(s_i^2 + \alpha^2)^2} (\sigma^2 + (s_i \Delta x_{a,i})^2) = n\sigma^2 \quad (15)$$

In an embodiment, a regularization coefficient is derived for each floating parameter. In such a case, the regularization coefficient $\alpha$ is replaced by a diagonal matrix in the equations above.

Figure 6:
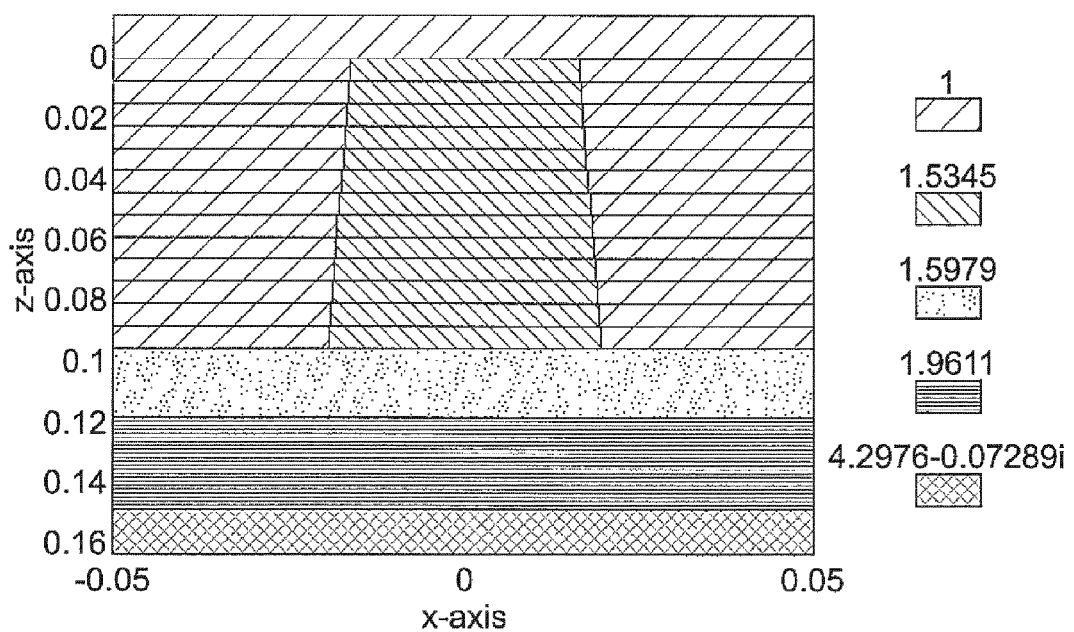
FIG. 6 depicts a model of a structure used in generating synthetic data.

An example of a case where use of the compact Discrepancy Principle or the compact chi² method is appropriate is now described with reference to FIGS. 6 and 7. FIG. 6 depicts the model of a line of a grating structure which is to be measured using scatterometry. The different styles of shading in FIG. 6 represent different refractive indices as indicated in the key. The grating is formed of a resist line on top of a bottom anti-reflection coating (BARC) under which is an SiN layer on top of an Si substrate. In a mathematical model of the structure, parameters allowed to float are the height of the resist line, width of the resist line at its base (bottom CD), width of the resist line at its top (top CD), height of the bottom anti-resist coating, height of the SiN layer and refractive index of the SiN layer. Refractive index and extinction coefficient k of the silicon layer can also be allowed to float in some cases. To evaluate the effectiveness of the present invention a synthetic data set comprising 50 simulated measurements based on a correct prediction with added noise were generated.

FIGS. 7A and 7B, FIG. 7B being a partial enlargement of FIG. 7A with an increased vertical scale, plot for each measurement the merit function F (equation 1) as a function of a. As can be seen from FIG. 7B, for many cases the merit function S curve does not intersect the line indicating the number of data points (2208) and for this level of applied noise, the approach using compact Discrepancy Principle or the compact chi² method is preferred.

Embodiments of the present invention may be implemented by implementing the methods described herein on the processing units PU described with reference to FIGS. 3 and 4 to provide an inspection apparatus for reconstructing an approximate structure of an object.

The processors described with reference to FIGS. 3 and 4 may operate under the control of computer programs containing one or more sequences of machine-readable instructions for calculating electromagnetic scattering properties of a structure, the instructions being adapted to cause one or more processors to perform the methods described herein.

Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term "electromagnetic" encompasses electric and magnetic.

The term "electromagnetic scattering properties" encompasses reflection and transmission coefficients and scatterometry measurement parameters including spectra (such as intensity as a function of wavelength), diffraction patterns (intensity as a function of position/angle) and the relative intensity of transverse magnetic- and transverse electric-polarized light and/or the phase difference between the transverse magnetic- and transverse electric-polarized light. Diffraction patterns themselves may be calculated for example using reflection coefficients.

Thus, although embodiments of the present invention are described in relation to reflective scattering, the invention is also applicable to transmissive scattering.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

REFERENCES

[1] V. A. Morozov. On the solution of functional equations by the method of regularization. *Soviet Math. Dokl.*, 7:414-417, 1966.

[2] V. A. Morozov. *Methods for Solving Incorrectly Posed Problems*. Springer, softcover reprint of the original 1st ed. 1984 edition, November 1984.

[3] Heinz W. Engl and Helmut Gfrerer. A posteriori parameter choice for general regularization methods for solving linear ill-posed problems. *Applied Numerical Mathematics*, 4(5):395-417, July 1988.

[4] U. Hämarik and T. Raus. On the choice of the regularization parameter in ill-posed problems with approximately given noise level of data. *Journal of Inverse and Ill-posed Problems*, 14(3):251-266, May 2006.

[5] J. L. Mead. A priori weighting for parameter estimation. *Journal of Inverse and Ill-posed Problems*, 16(2):175-193, January 2008.

[6] Charles L. Lawson and Richard J. Hanson. *Solving Least Squares Problems (Classics in Applied Mathematics)*. Society for Industrial and Applied Mathematics, January 1987.

[7] P. C. Hansen. The L-Curve and its Use in the Numerical Treatment of Inverse Problems. In *in Computational Inverse Problems in Electrocardiology*, ed. P. Johnston, Advances in Computational Bioengineering, volume 4, pages 119-142, 2000.

[8] G. Wahba. Practical Approximate Solutions to Linear Operator Equations When the Data are Noisy. *SIAM Journal on Numerical Analysis*, 14:651-667, September 1977.

[9] Gene H. Golub, Michael Heath, and Grace Wahba. Generalized Cross-Validation as a Method for Choosing a Good Ridge Parameter. *Technometrics*, 21(2):215-223, 1979.

[10] C. L. Mallows. Some Comments on C p. *Technometrics*, 15(4):661-675, November 1973.

[11] Teresa Regińska. A Regularization Parameter in Discrete Ill-Posed Problems. *SIAM Journal on Scientific Computing*, 17(3):740-749, May 1996.

[12] P. C. Hansen, M. E. Kilmer, and R. H. Kjeldsen. Exploiting Residual Information in the Parameter Choice for Discrete Ill-Posed Problems. *BIT Numerical Mathematics*, 46(1):41-59, 2006.

[13] Bert W. Rust and Dianne P. O'Leary. Residual periodograms for choosing regularization parameters for ill-posed problems. *Inverse Problems*, 24(3):034005+, June 2008.

What is claimed is:

1. A method of calculating electromagnetic scattering properties of a structure, the method comprising:
   illuminating, using an illumination system, the structure with radiation;
   measuring, using a detection system, radiation scattered from the structure to obtain measurement data;
   obtaining a prior estimate of the electromagnetic scattering properties of the structure;
   deriving a regularization coefficient based on the measurement data;
   obtaining estimates of the electromagnetic scattering properties by using trial values of the electromagnetic scattering properties and the regularization coefficient;
   determining whether a termination condition is met using a merit function, parameters of the merit function including the regularization coefficient the prior estimate, and the estimates of the electromagnetic scattering properties; and
   if the termination condition is not met, iteratively repeating the obtaining a prior estimate and the deriving a regularization coefficient until the termination condition is satisfied;
   whereby the trial values provided by a final iteration represent the calculated electromagnetic scattering properties.

2. The method according to claim 1, wherein the deriving a regularization coefficient comprises finding a value for the regularization coefficient which gives a predetermined value for a second merit function.

3. The method according to claim 2, wherein the second merit function used for finding the value for the regularization coefficient is same as the merit function for obtaining estimates of the electromagnetic scattering properties.

4. The method according to claim 2, wherein a compact merit function is used for finding the value for the regularization coefficient.

5. The method according to claim 2, wherein the predetermined value is equal to a number of data points in the measurement data.

6. The method according to claim 2, wherein the predetermined value is equal to a number of scattering properties.

7. The method according to claim 1, wherein the deriving a regularization coefficient uses a method of: the discrepancy principle; generalized discrepancy principle; modified discrepancy principle; transformed discrepancy principle; the chi-squared principle; the L-curve; generalized cross validation (GCV); unbiased predictive risk estimator; Regińska's rule; or the normalized cumulative periodogram (NCP).

8. The method according to claim 1, wherein the deriving a regularization coefficient comprises calculating a regularization coefficient per scattering property.

9. An inspection apparatus for estimating electromagnetic scattering properties of a structure of an object, the inspection apparatus comprising:
   an illumination system configured to illuminate the object with radiation;
   a detection system configured to measure radiation scattered from the structure of the object to obtain measurement data; and
   a processor configured to estimate the electromagnetic scattering properties using operations comprising:
      obtaining a prior estimate of the electromagnetic scattering properties of the structure;
      deriving a regularization coefficient based on the measurement data;
      obtaining estimates of the electromagnetic scattering properties by using trial values of the electromagnetic scattering properties and the regularization coefficient;
      determining whether a termination condition is met using a merit function, parameters of the merit function including the regularization coefficient the prior estimate, and the estimates of the electromagnetic scattering properties; and
      if the termination condition is not met, iteratively repeating the obtaining a prior estimate and the deriving a regularization coefficient until the termination condition is satisfied;
      whereby the trial values provided by a final iteration represent the calculated electromagnetic scattering properties.

10. A method comprising:
    illuminating, using an illumination system, a structure with radiation;
    measuring, using a detection system, radiation scattered from the structure to obtain measurement data;
    using a non-transient computer readable medium comprising machine-readable instructions for calculating electromagnetic scattering properties of the structure, the instructions configured to cause one or more processors to perform operations comprising:
       obtaining a prior estimate of the electromagnetic scattering properties of the structure;
       deriving a regularization coefficient based on the measurement data;
       obtaining estimates of the electromagnetic scattering properties by using trial values of the electromagnetic scattering properties and the regularization;
       determining whether a termination condition is met using a merit function, parameters of the merit function including the regularization coefficient the prior estimate, and the estimates of the electromagnetic scattering properties; and
       if the termination condition is not met, iteratively repeating the obtaining a prior estimate and the deriving a regularization coefficient until the termination condition is satisfied;
       whereby the trial values provided by a final iteration represent the calculated electromagnetic scattering properties.

11. The method according to claim 1, wherein the deriving a regularization coefficient comprises calculating an optimal value for the regularization coefficient.

12. The method according to claim 1, wherein the deriving a regularization coefficient comprises using a singular value decomposition (SVD) to reduce a number of data points in the measurement data.

13. The method according to claim 1, further comprising:
    determining whether the regularization coefficient is to be used for obtaining the estimates of the electromagnetic scattering properties.

14. The method according to claim 13, further comprising:
    in response to determining that the regularization coefficient is to be used for obtaining the estimates of the electromagnetic scattering properties, determining whether a set value of the regularization coefficient is to be used.

\* \* \* \* \*

UNITED STATES PATENT AND TRADEMARK OFFICE
CERTIFICATE OF CORRECTION

PATENT NO. : 9,939,250 B2
APPLICATION NO. : 15/036471
DATED : April 10, 2018
INVENTOR(S) : Pisarenco et al.

It is certified that error appears in the above-identified patent and that said Letters Patent is hereby corrected as shown below:

Column 17, Line 26, Claim 1 insert --,-- after "the regularization coefficient"

Column 18, Line 16, Claim 9 insert --,-- after "the regularization coefficient"

Signed and Sealed this
Second Day of October, 2018

Andrei Iancu
*Director of the United States Patent and Trademark Office*